(12) United States Patent
Kitamura et al.

(10) Patent No.: US 7,655,572 B2
(45) Date of Patent: Feb. 2, 2010

(54) SEMICONDUCTOR DEVICE MANUFACTURING METHOD, SEMICONDUCTOR DEVICE MANUFACTURING APPARATUS, CONTROL PROGRAM AND COMPUTER STORAGE MEDIUM

(75) Inventors: Akinori Kitamura, Nirasaki (JP); Masanobu Honda, Nirasaki (JP); Nozomi Hirai, Nirasaki (JP); Masahiro Nakamura, Tokyo (JP); Tatsuya Sugimoto, Tokyo (JP)

(73) Assignees: Tokyo Electron Limited, Tokyo (JP); Zeon Corporation, Tokyo (JP)

( * ) Notice: Subject to any disclaimer, the term of this patent is extended or adjusted under 35 U.S.C. 154(b) by 0 days.

(21) Appl. No.: 11/551,495

(22) Filed: Oct. 20, 2006

(65) Prior Publication Data

US 2007/0090093 A1    Apr. 26, 2007

Related U.S. Application Data

(60) Provisional application No. 60/754,289, filed on Dec. 29, 2005.

(30) Foreign Application Priority Data

Oct. 24, 2005    (JP)    ............................ P2005-308363

(51) Int. Cl.
*H01L 21/302*    (2006.01)

(52) U.S. Cl. ...................... 438/714; 438/706; 438/710; 216/67

(58) Field of Classification Search ................ 438/706, 438/710, 712, 714, 717, 720; 216/67, 79
See application file for complete search history.

(56) References Cited

U.S. PATENT DOCUMENTS

| | | | |
|---|---|---|---|
| 6,635,185 B2 * | 10/2003 | Demmin et al. | ............... 216/64 |
| 6,842,658 B2 | 1/2005 | Izawa et al. | |
| 2002/0103563 A1 * | 8/2002 | Izawa et al. | ................. 700/121 |
| 2005/0011859 A1 | 1/2005 | Ji et al. | |

FOREIGN PATENT DOCUMENTS

| | | |
|---|---|---|
| CN | 1477681 A | 2/2004 |
| CN | 1612305 A | 5/2005 |
| EP | 1 498 941 A2 | 1/2005 |
| EP | 1498941 A2 * | 1/2005 |
| JP | 2002-231596 | 8/2002 |
| JP | 2005-39277 | 2/2005 |

* cited by examiner

*Primary Examiner*—Lan Vinh
(74) *Attorney, Agent, or Firm*—Oblon, Spivak, McClelland, Maier & Neustadt, L.L.P.

(57) ABSTRACT

Photoresist film is used as a mask, plasma etching of a $SiO_2$ film is selectively performed to a photoresist film, and a hole is formed. An etching gas comprising unsaturated fluorocarbon gas containing oxygen expressed with $C_xF_yO$ (y/x is 1-1.5 at an integer in x, as for 4 or 5, and y) is used for the plasma etching. $C_4F_4O$ gas and $C_4F_6O$ gas are used for the unsaturated fluorocarbon gas containing oxygen, for example.

5 Claims, 4 Drawing Sheets

SEMICONDUCTOR DEVICE MANUFACTURING METHOD, SEMICONDUCTOR DEVICE MANUFACTURING APPARATUS, CONTROL PROGRAM AND COMPUTER STORAGE MEDIUM

CROSS-REFERENCE TO RELATED APPLICATIONS

This application is based upon and claims the benefit of priority from the prior Japanese Patent Application No. 2005-308363, filed on Oct. 24, 2005; and the prior U.S. Patent Provisional Application No. 60/754,289, filed on Dec. 29, 2005; the entire contents of which are incorporated herein by reference.

BACKGROUND OF THE INVENTION

1. Field of the Invention

The present invention relates to a semiconductor device manufacturing method, a semiconductor device manufacturing apparatus, a control program, and a computer storage medium, which has an etching process which etches a dielectric film containing Si by using a photoresist as a mask.

2. Description of the Related Art

In a manufacturing process of a semiconductor device, it is known to form a contact hole or the like according to an etching process which etches a dielectric film containing Si (for example, a $SiO_2$ film, a SiOC film, or the like) by using a photoresist as a mask. And, for example, in such an etching process, it is proposed to use fluorocarbon gas containing oxygen as an etching gas.

As related art which uses a gas which contains fluorocarbon gas containing oxygen as the etching gas, it is known the art of etching by use of a gas containing $C_5F_8O_2$ for example, so that the selectivity of the dielectric film containing Si to the photoresist (etching rate of the dielectric film containing Si/etching rate of the photoresist) become around 5.55 (see to Japanese Patent Application Laid-open No. 2005-39277 for example.).

It is also known that a mixed gas of fluorocarbon gas such as $C_5F_8$, $C_4F_6$, and $C_4F_4O$, inert gas (Ar), and oxygen, carbon monoxide is available to the etching gas for etching a dielectric film containing Si (see to Japanese Patent Application Laid-Open No. 2002-231596 for example).

SUMMARY

Conventionally, it is proposed fluorocarbon gas containing oxygen as above-mentioned. However, in the conventional art which uses such fluorocarbon gas containing oxygen in the etching process etching the dielectric film containing Si by use of the photoresist as the mask, the obtained selectivity is around 5.55.

On the other hand, in the etching process which etches the dielectric film containing Si by use of the photoresist as the mask, it is desired to develop the semiconductor device manufacturing method which enables to improve the selectivity of the dielectric film containing Si to the photoresist further for forming thinner film of the photoresist and for increasing the productivity.

The present invention is coped made in consideration of above-mentioned conventional situations. An object of the present invention is to provide a semiconductor device manufacturing method, a semiconductor device manufacturing apparatus, a control program, and a computer storage medium, which enables to improve the selectivity of the dielectric film containing Si to the photoresist in the etching process compared with the prior art.

One aspect of the present invention is a manufacturing method of a semiconductor device comprising a plasma etching step for performing plasma etching of a dielectric film containing Si formed on a substrate to be processed by use of a photoresist as a mask, wherein the plasma etching step performs the plasma etching by use of an etching gas comprising unsaturated fluorocarbon gas containing oxygen expressed with CxFyO (x is 4 or 5, y is an integer, y/x is from not less than 1 to not more than 1.5) so as to etch the dielectric film containing Si selectively to the photoresist.

Another aspect of the present invention is a manufacturing method of a semiconductor device comprising a plasma etching step for performing plasma etching of a dielectric film containing Si formed on a substrate to be processed by use of a photoresist as a mask, wherein the plasma etching step performs the plasma etching by use of an etching gas comprising $C_4F_4O$ gas so as to etch the dielectric film containing Si selectively to the photoresist.

Another aspect of the present invention is a manufacturing method of a semiconductor device comprising a plasma etching step for performing plasma etching of a dielectric film containing Si formed on a substrate to be processed by use of a photoresist as a mask, wherein the plasma etching step performs the plasma etching by use of an etching gas comprising $C_4F_6O$ gas so as to etch the dielectric film containing Si selectively to the photoresist.

For the etching gas, for example, mixed gas comprising $C_4F_4O$ gas, at least one rare gas selected from the group consisting of Ne, Ar, Kr, and Xe, and at least one deposition removal gas selected from the group consisting of $O_2$, $N_2$, and CO can be used suitably.

Also, as the etching gas, mixed gas comprising $C_4F_6O$ gas, $C_4F_6$ gas, at least one rare gas selected from the group consisting of Ne, Ar, Kr, and Xe, and at least one deposition removal gas selected from the group consisting of $O_2$, $N_2$, and CO can be used suitably.

An $O_2$ gas can be used suitably for the deposition removal gas. An Ar gas can be used suitably for the rare gas. When $C_4F_4O$ gas and $O_2$ gas are used, among the etching gas, it is preferred to make the ratio of the flow rate of $O_2$ gas to the flow rate of $C_4F_4O$ gas (flow rate of $O_2$ gas/flow rate of $C_4F_4O$ gas) into the range from not less than 1 to not more than 1.35.

In one aspect of the present invention, in the plasma etching step of the above-mentioned manufacturing method of the semiconductor device is performed by applying high-frequency power between an upper electrode and a lower electrode in a process chamber, the lower electrode in which the substrate to be processed is laid thereon and the upper electrode facing the lower electrode being arranged in the process chamber.

In this case as the high-frequency power, the first high-frequency power applied to the upper electrode and the second high-frequency power whose frequency is lower than that of the first high-frequency power applied to the lower electrode can be suitably used. Also as the high-frequency power, the first high-frequency power applied to the lower electrode, and second high-frequency power whose frequency is lower than that of the first high-frequency power applied to the lower electrode can be suitably used.

One aspect of the present invention is manufacturing apparatus of a semiconductor device comprising, a process chamber for accommodating a substrate to be processed, an etching gas supply unit for supplying an etching gas into the process chamber, a plasma generating unit for generating plasma of the etching gas supplied from the etching gas supply unit to perform plasma etching of the substrate to be processed, a control unit for controlling the plasma etching in the process chamber such that the above-mentioned manufacturing method of the semiconductor device is performed.

One aspect of the present invention is a control program to be executed by a computer, for controlling a manufacturing apparatus of a semiconductor device such that the above-mentioned manufacturing method of the semiconductor device is performed when execution.

One aspect of the present invention is a computer storage medium storing a control program to be executed by a computer, wherein the control program controls a manufacturing apparatus of semiconductor device such that the above-mentioned manufacturing method of semiconductor device is performed when execution.

DETAILED DESCRIPTION OF THE EMBODIMENTS

Figure 1A:
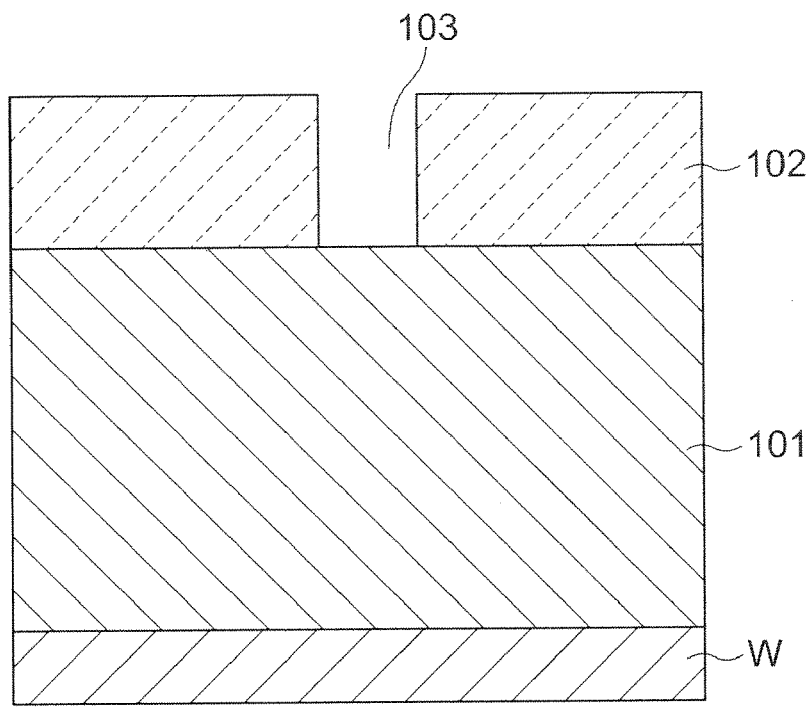
FIG. 1A and FIG. 1B are views showing a sectional structure of a semiconductor wafer according to an embodiment of a semiconductor device manufacturing method of the present invention.
Figure 1B:
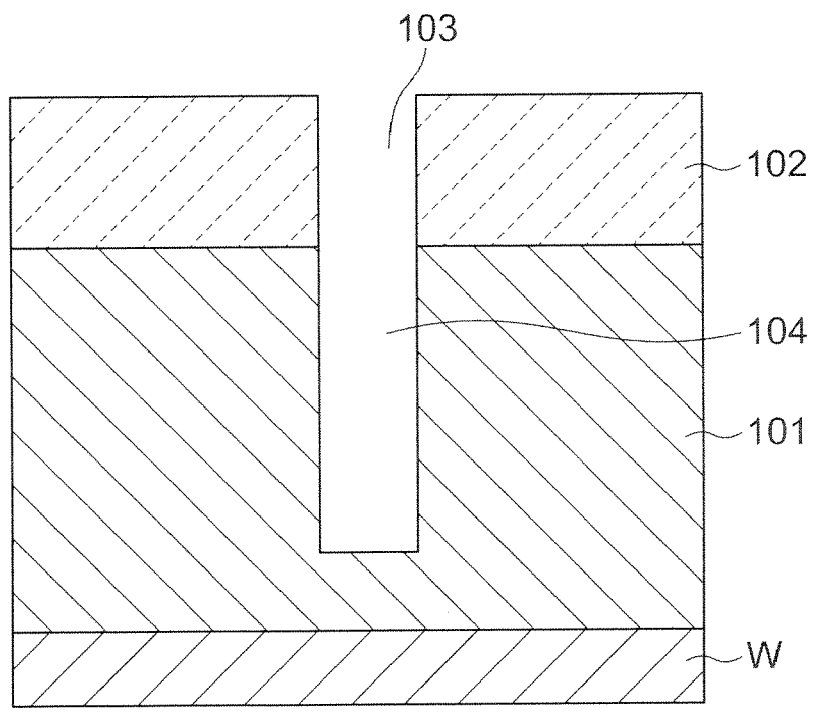
Figure 2:
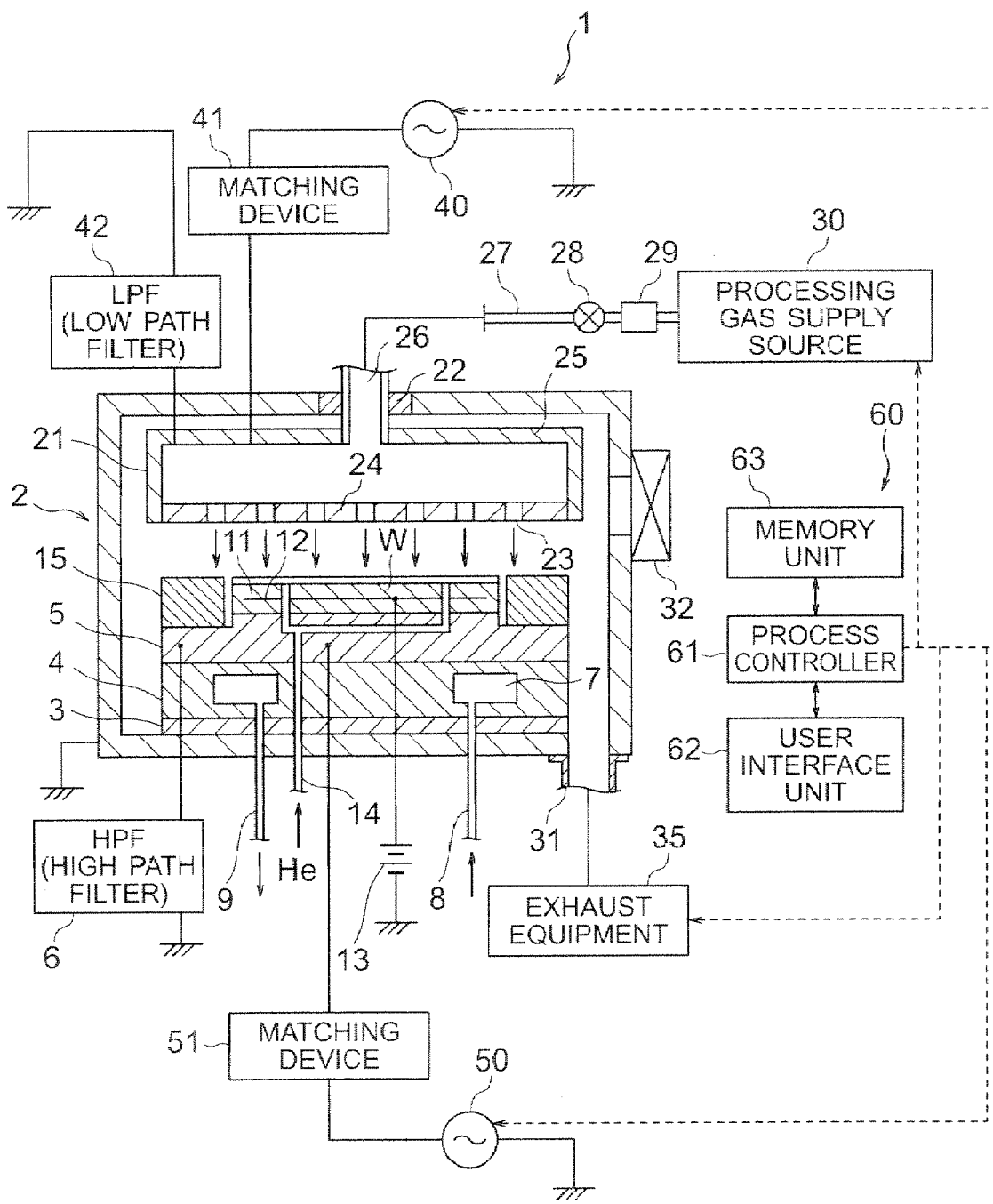
FIG. 2 is a diagram showing a schematic structure of a semiconductor device manufacturing apparatus according to an embodiment of the present invention.

Hereinafter, an embodiment of the present invention will be described with reference to the drawings. FIG. 1A and FIG. 1B enlarge and illustrate a sectional structures of a semiconductor wafer W as a substrate to be processed in a semiconductor device manufacturing method according to this embodiment. FIG. 2 illustrates a sectional schematic structure of the plasma processing apparatus as a semiconductor manufacturing apparatus according to this embodiment. First, the composition of the plasma processing apparatus will be described with reference to the FIG. 2.

A plasma processing apparatus 1 is constituted as a capacitive-coupling parallel plates type plasma etching apparatus, in which upper and lower electrode plates are facing each other in parallel and the power supply for plasma formation is connected.

The plasma processing apparatus 1 has a process chamber (a processing vessel) 2 formed in a circular cylindrical shape made of, for example, aluminum or the like with anodized on its surface. The process chamber 2 is grounded. A substantially circular cylindrical susceptor supporting table 4 is provided at a bottom in the chamber 2 with an insulating plate 3 intervening therebetween, for mounting an object to be processed, for example, a semiconductor wafer W thereon. Further, on the susceptor supporting table 4, a susceptor 5 is provided which constitutes a lower electrode. To the susceptor 5, a high pass filter (HPF) 6 is connected.

Inside of the susceptor supporting table 4, a refrigerant room 7 is provided. A refrigerant is introduced into there refrigerant room 7 via a refrigerant introducing pipe 8, and circulates in the refrigerant room 7. That cold heat is transferred to the semiconductor wafer W via the susceptor 5. Thereby, the semiconductor wafer W is controlled in the desired temperature.

The susceptor 5 is formed such that its upper central portion is formed in a projecting circular disc shape on which an electrostatic chick 11 having almost the same shape as that of the semiconductor wafer W is provided. The electrostatic chuck 11 is configured to dispose an electrode 12 within an insulating material. A direct-current voltage of, for example, 1.5 kV is then applied from a direct-current power supply 13 connected to the electrode 12 to electrostatically attract the semiconductor wafer W, for example, by Coulomb force.

At on the insulating plate 3, the susceptor supporting table 4, the susceptor 5, and the electrostatic chuck 11, a gas passage 14 is formed for supplying a heat-transfer medium (for example, He gas or the like) to the rear surface of the semiconductor wafer W. Via the heat-transfer medium, the cold heat of the susceptor 5 is transferred to the semiconductor wafer W to keep the semiconductor wafer W at a predetermined temperature.

At the peripheral portion of the upper end of the susceptor 5, an annular focus ring 15 is disposed to surround the semiconductor wafer W mounted on the electrostatic chuck 11. The focus ring 15 is made, for example, of a conductive material such as silicon, and has a function to improve the uniformity of etching.

Above the susceptor 5, an upper electrode 21 is provided opposed to and in parallel with the susceptor 5. The upper electrode 21 is supported by an upper portion of the chamber 2 via an insulating material 22 The upper electrode 21 is composed of an electrode plate 24 which is made of aluminum with its surface being subjected to anodic oxidization treatment (alumite treatment) and is provided with a quartz cover and which constitutes an opposed surface to the susceptor 5 and has a number of discharge holes 23, and an electrode supporter 25 made of a conductive material which supports the electrode 24. The susceptor 5 and the upper electrode 21 are configured such that a distance therebetween is changeable.

A gas introducing port 26 is provided at the center of the electrode supporter 25 in the upper electrode 21, and a gas supply pipe 27 is connected to the gas introducing port 26. Further to the gas supply pipe 27, a processing gas supply source 30 is coupled via a valve 28 and a mass-flow controller 29. From the processing gas supply source 30, an etching gas as processing gas is supplied.

To the bottom of the process chamber 2, an exhaust pipe 31 is connected, and to the exhaust pipe 31, an exhaust equipment 35 is connected. The exhaust equipment 35 comprises a vacuum pump such as a turbo-molecule pump and can evacuate the chamber 2 to a predetermined reduced pressure atmosphere, for example, a predetermined pressure equal to or lower than 1 Pa. Further, a gate valve 32 is provided on a side wall of the chamber 2 so that the semiconductor wafer W is carried to/from an adjacent load lock chamber (not shown) with the gate valve 32 opened.

A first high-frequency power supply 40 is coupled to the upper electrode 21, and a matching device 41 is interposed in its power supply line. Further, a low pass filter (LPF) 42 is connected to the upper electrode 21. The first high-frequency power supply 40 has frequencies within a range from 50 MHz to 150 MHz. Application of such a high frequency allows high-density plasma to be formed in a preferable dissociation state in the chamber 2.

A second high-frequency power supply 50 is coupled to the susceptor 5 as the lower electrode, and a matching device 51 is interposed in its power supply line. The second high-frequency power supply 50 has frequencies within a range lower than that of the first high-frequency power supply 40, so that application of a frequency in such range allows an appropriate ion action to be provided to the semiconductor wafer W that is the object to be processed without damage thereto. It is preferable that the frequencies of the second high-frequency power supply 50 range from 1 MHz to 20 MHz.

The action of the plasma processing apparatus 1 configured as described above is comprehensively controlled by a control unit 60. The control unit 60 has a process controller 61 which includes a CPU and controls each part of the plasma processing apparatus 1, a user interface 62, and a memory unit 63.

The user interface 62 is constituted of a key board of which a process manager executes an input operation of command to manage the plasma processing apparatus 1, a display for displaying the state of operation to be visible, and the like.

In the memory unit 63, control programs (software) for realizing various kind of processes which are executed in the plasma processing apparatus 1 by controlling of the process controller 61 and recipes in which processing conditions and the like are memorized are stored. And as need arises, by accessing any recipe in the memory unit 63 according to the instruction and the like from the user interface 62 and by operating the process controller 61, required processes in the plasma processing apparatus 1 are executed under the control of the process controller 61. And, as the processing program and recipes of data of processing conditions and the like, it is possible to use those stored in the computer storage medium (for example, hard disk, CD, flexible disk, semiconductor memory and the like), which can be read with a computer, or to use with on-line system those obtained by transmitting from other apparatus at any time through a private line for example.

When the dielectric film containing Si (for example, a $SiO_2$ film, a SiOC film, or the like) formed on a semiconductor wafer W is etched selectively to photoresist as a mask, using the plasma processing apparatus 1 having the structure described above, first, after the gate valve 32 is opened, the semiconductor wafer W is carried into the process chamber 2 from the load-lock-room which is not shown, and mounted on the electrostatic chuck 11. Next, by applying DC voltage to the electrode 12 from the direct current power supply 13, the semiconductor wafer W is electrostatic-absorbed on the electrostatic chuck 11. Next, the gate valve 32 is closed, and then the inside of the chamber 2 is evacuated to the predetermined vacuum using the exhaust equipment 35.

Thereafter, the valve 28 is opened, a predetermined etching gas is introduced from the processing gas supply source 30 into a hollow portion of the upper electrode 21 through a processing gas supply pipe 27 and the gas feed port 26 while controlling the flow rate by the mass-flow controller 29, and then the etching gas is uniformly discharged to the semiconductor wafer W through discharge holes 23 of the electrode plate 24, as shown by the arrow in FIG. 2.

Then, a pressure in the inside of the chamber 2 is maintained to a predetermined pressure. Thereafter, a high-frequency power having a predetermined frequency is applied to the upper electrode 21 from the first high-frequency power supply 40. Thereby, a high frequency electric field is generated between the upper electrode 21 and the susceptor 5 as the lower electrode and then the etching gas is dissociated and plasmatized.

On the other hand, from the second high-frequency power supply 50, a high-frequency power having a frequency lower than that of the first high-frequency power supply 40 is applied to the susceptor 5 which is a lower electrode. Thereby, ions in the plasma are drawn into the susceptor 5 side, an anisotropy of etching is enhanced by ion-assist.

Then, when the predetermined etching processing is finished, the supply of the high-frequency power and the etching gas is stopped, the semiconductor wafer W is carried out from the process chamber 2, with a process opposite to the process described above.

Next, with reference to FIG. 1, a semiconductor device manufacturing method according to this embodiment will be described. As shown in FIG. 1A, a dielectric film containing Si 101 (for example, a $SiO_2$ film, a SiOC film, or the like) of the predetermined thickness (for example, 2000 nm) is formed on the surface of the semiconductor wafer W as a substrate to be processed. A photoresist film 102 of the predetermined thickness (for example, 660 nm) is formed on the surface of the dielectric film containing Si 101. A predetermined pattern is transferred by exposure, the development process or the like so that the photoresist film 102 becomes a mask which has an opening 103 of a prescribed pattern. The semiconductor wafer W is carried into the process chamber 2 of the plasma processing apparatus 1 in this state.

Within the process chamber 2, the photoresist film 102 is used as a mask, plasma etching of the dielectric film containing Si 101 is carried out selectively to the photoresist film 102, as shown in FIG. 1B, holes 104, such as a contact hole, are formed. The etching gas containing an unsaturated fluorocarbon gas containing oxygen expressed with $CxFyO$ (x is 4 or 5, y is an integer, y/x is from 1 to 1.5, inclusive) is used for this plasma etching. For this unsaturated fluorocarbon gas containing oxygen, $C_4F_4O$ gas and $C_4F_6O$ gas can be used, for example.

When using $C_4F_4O$ gas, as etching gas, for example, the mixed gas containing $C_4F_4O$ gas, at least one rare gas selected from the group consisting of Ne, Ar, Kr, and Xe, and at least one depo-removal-gas (deposition removal gas) selected from the group consisting of $O_2$, $N_2$, and CO can be used suitably. In one example, the mixed gas containing $C_4F_4O$ gas, Ar gas, and $O_2$ gas can be used suitably. Other gas, for instance, rare gas or the like can be added to such mixed gas if needed. When using the above-mentioned mixed gas, the ratio of the flow rate of $O_2$ gas to the flow rate of $C_4F_4O$ gas (flow rate of $O_2$ gas/flow rate of $C_4F_4O$ gas) preferably is in the range from 1 to 1.35, inclusive. This reason is mentioned later. As $C_4F_4O$, the structure as shown below can be used, for example.

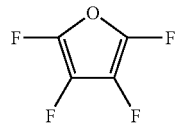

[Formula 1]

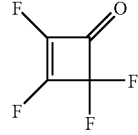

[Formula 2]

When using $C_4F_6O$ gas, as etching gas, for example, the mixed gas containing $C_4F_6O$ gas, $C_4F_6$ gas, at least one rare gas selected from the group consisting of Ne, Ar, Kr, and Xe, and at least one depo-removal-gas (deposition removal gas) selected from the group consisting of $O_2$, $N_2$, and CO can be used suitably. In one example, the mixed gas containing $C_4F_6O$ gas, $C_4F_6$ gas, Ar gas, and $O_2$ gas can be used suitably. As $C_4F_6O$, the structure as shown below can be used, for example.

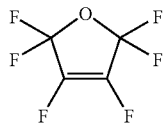

[Formula 3]

EXAMPLE 1

As example 1, the plasma processing apparatus 1 shown in FIG. 2 was used, and the above-mentioned plasma etching step was performed to the semiconductor wafer W (the photoresist film (P. R.)=660 nm, the dielectric film containing Si ($SiO_2$ film)=2000 nm) of the structure shown in FIG. 1A and FIG. 1B with the recipe such as shown below, and the hole 104 whose diameter is 0.15 μm was formed.

The processing recipe of each example shown below is read from the memory unit 63 of the control unit 60, and is incorporated into the process controller 61. When the process controller 61 controls each part of the plasma processing apparatus 1 based on the control program, the etching process as the read processing recipe is performed.

Figure 3:
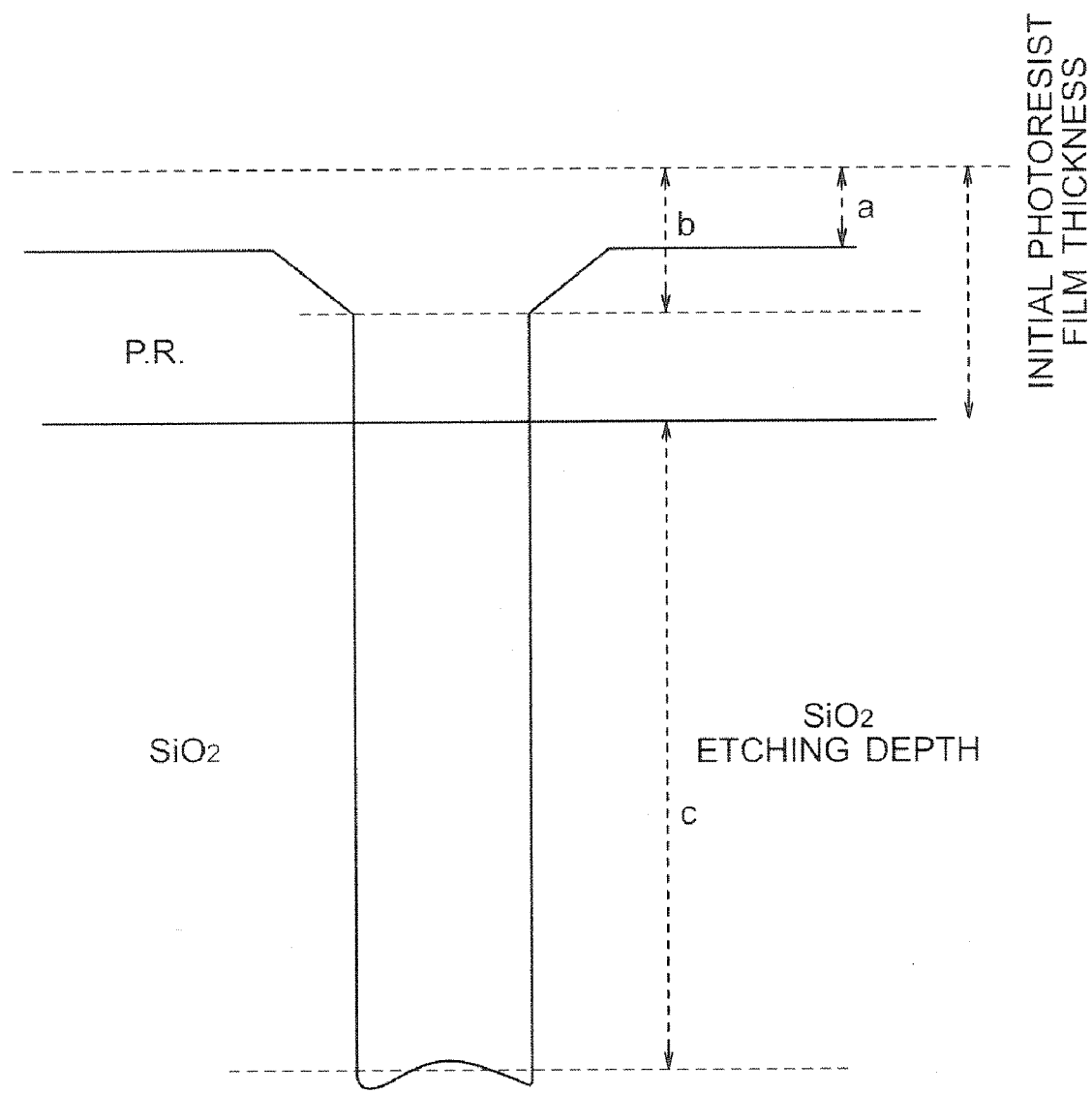
FIG. 3 is a diagram for illustrating the definition of an etching rate and a selectivity in the flat part and in the facet part.

Etching gas: $C_4F_4O/Ar/O_2$=20/300/24 sccm
Pressure: 2.0 Pa (15 mTorr)
Power (upper part/lower part): 2200 W (60 MHz)/1800 W (2 MHz)
Interval between electrodes: 25 mm
Temperature (upper part/side wall part/lower part):60/50/-10° C.
Etching time: 180 seconds The etching rate of the $SiO_2$ film in the hole part in the above-mentioned plasma etching step was 532 nm/min. The selectivity of $SiO_2$ film to the photoresist (etching rate of the $SiO_2$ film/etching rate of the photoresist) was 13.7 in the flat part, 7.2 in the facet part. The etching rate of the above-mentioned $SiO_2$ film indicates, as shown in FIG. 3, the value which is given by dividing the etching depth 'c' of the hole produced by etching, by the etching time. Also, the etching rate of the photoresist indicates the value which is given by dividing thickness 'a' etched at the flat part of the photoresist by the etching time. The selectivity of the flat part indicates, as shown in FIG. 3, the ratio of above 'c' to the thickness 'a' etched at the flat part of the photoresist for "initial photoresist film thickness" (c/a). The facet part etched aslant formed in a part of the inlet section of the opening of the photoresist, as shown in FIG. 3. The selectivity of the facet part indicates the ratio of above 'c' to the thickness 'b' etched at this facet part for "initial photoresist film thickness" (c/b) since.

As a comparative example, the plasma etching step was performed on the same conditions as above except that the etching gas was changed into $C_4F_6/Ar/O_2$=20/300/17 sccm. As the result, the etching rate of $SiO_2$ film in the hole part was 539 nm/min, the selectivity of the $SiO_2$ film to the photoresist was 10.6 in the flat part and was 6.1 in the facet part.

In the above-mentioned example 1, the almost same etching rate as the case of the comparative example was obtained, and the selectivity of the $SiO_2$ film to the photoresist was improved approximately 30% in the flat part, approximately 20% in the facet part, compared with the case of the comparative example. The capability of forming deep hole (capability of forming deep hole without etch-stop) about hole-diameter of 0.15 μm was almost the same.

Figure 4:
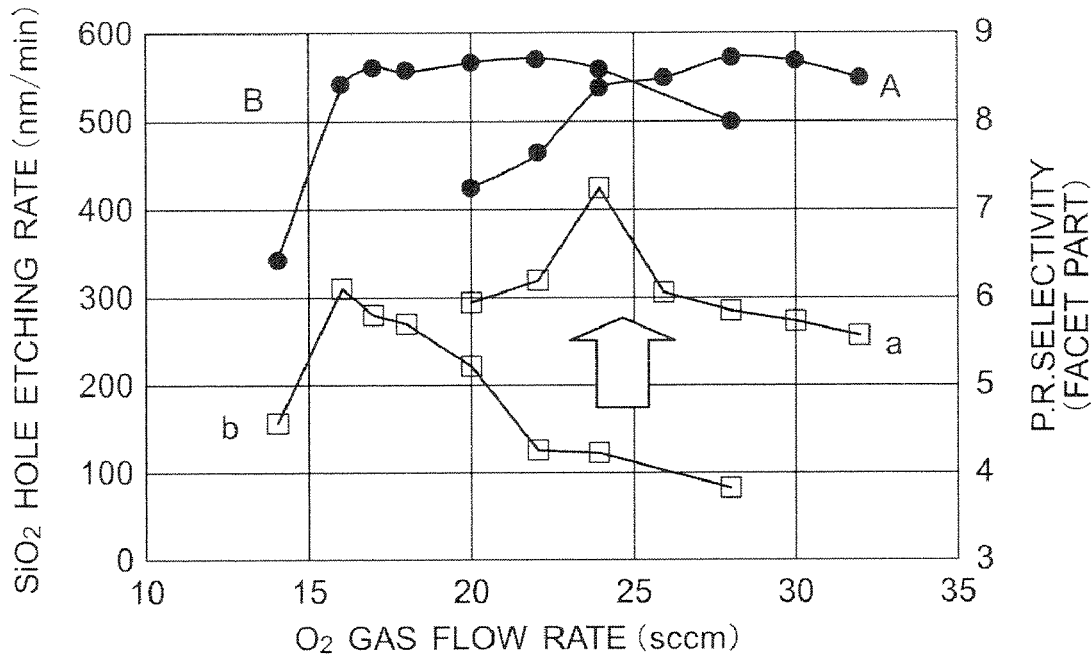
FIG. 4 is a graph showing the relationship of the oxygen flow rate, the etching rate, and the selectivity in the facet part.
Figure 5:
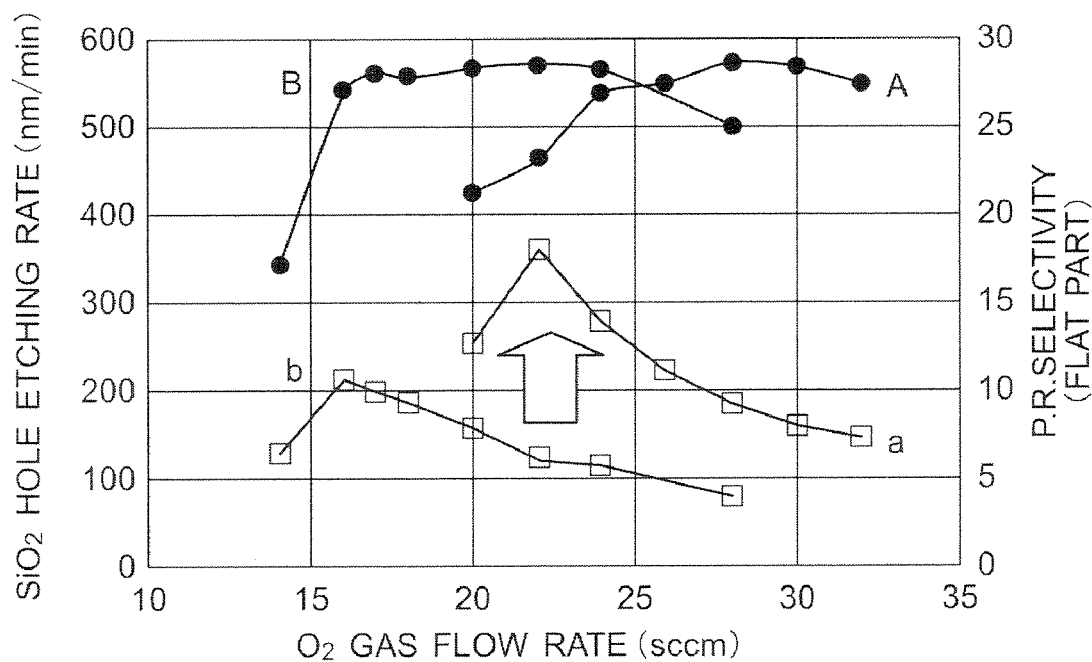
FIG. 5 is a graph showing the relationship of the oxygen flow rate, the etching rate, and the selectivity in the flat part.

The graphs of FIG. 4 and FIG. 5 show the changes of the etching rate ('A' for the example, 'B' for the comparative example) and the selectivity of the $SiO_2$ film to the photoresist ('a' for the example, 'b' for the comparative example) when the flow rate of $O_2$ of the etching gas is changed, in the above-mentioned example and the above-mentioned comparative example. FIG. 4 shows the case of the facet part, and FIG. 5 shows the case of the flat part. As shown in FIG. 4 and FIG. 5, when the flow rate of $C_4F_4O$ was 20 sccm, by making $O_2$ flow rate within the range from not less than 20 sccm to not more than 27 sccm and making the flow rate ratio of them ($O_2$ flow rate/$C_4F_4O$ flow rate) within the range from not less than 1 to not more than 1.35, the selectivity of $SiO_2$ film to the photoresist was enlarged, compared with the case of the comparative example. When $C_4F_4O$ flow rate was increased more than $O_2$ flow rate and the above-mentioned flow rate ratio was made into less than 1, the etching rate of $SiO_2$ film was decreased sharply. For this reason, the above-mentioned flow rate ratio is preferred to be at least 1 or more.

EXAMPLE 2

Next, as example 2, the plasma processing apparatus 1 shown in FIG. 2 was used, and the above-mentioned plasma etching step was performed to the semiconductor wafer W (the photoresist film=660 nm, the $SiO_2$ film=2000 nm) having the structure shown in FIG. 1 with the recipe as shown below, and the hole 104 whose diameter was 0.15 μm was formed.

The processing recipe of the example 2 shown below is read from the memory unit 63 of the control unit 60, and is incorporated into the process controller 61, and when the process controller 61 controls each part of plasma processing apparatus 1 based on the control program, the etching process as the read processing recipe is performed.

Etching gas: $C_4F_6O/C_4F_6/Ar/O_2$=10/20/300/25 sccm
Pressure: 2.0 Pa (15 mTorr)
Power (upper part/lower part): 2200 W (60 MHz)/1800 W (2 MHz)
Interval between electrodes: 25 mm
Temperature (upper part/side wall part/lower part): 60/50/–10° C.
Etching time: 3 minutes The etching rate of the $SiO_2$ film in the hole part in the above-mentioned plasma etching step was 606 nm/min. The selectivity of the $SiO_2$ film to the photoresist (etching rate of the $SiO_2$ film/etching rate of the photoresist) was 8.6 in the flat part and was 6.0 in the facet part.

As the comparative example, the plasma etching step was performed on the same conditions as the above except that the etching gas was changed into $C_4F_6/Ar/O_2$=20/300/20 sccm. As the result, the etching rate of $SiO_2$ film in the hole part was 533 nm/min, the selectivity of $SiO_2$ film to the photoresist was 6.0 in the flat part and was 5.0 in the facet part.

In the above-mentioned example, a higer etching rate than the comparative example was obtained, and the selectivity of the $SiO_2$ film to the photoresist was improved approximately 40% in the flat part, approximately 20% in the facet part, compared with the case of the comparative example. The capability of forming deep hole about hole-diameter of 0.15 μm was almost the same as the example 1.

According to the present embodiment, in the plasma etching step in the manufacturing method of the semiconductor manufacturing device, the selectivity of the dielectric film containing Si to the photoresist can be improved compared with the former one as described above. The present inventions are not limited to the above-mentioned embodiments, and various kinds of modification may be applied to them. For example, plasma processing apparatuses are not limited to the type of applying high frequency power to upper and lower parts with flat panel in parallel as shown in FIG. 2. The type of applying the power with two frequencies to lower electrode or other of the plasma processing apparatuses can be used.

As mentioned above, although the embodiments of the invention and the examples have are described in full detail with the drawings, the present invention is not limited to the embodiment or the examples described above. The various design variation can be made within the scope which does not deviate from the gist of the present invention.

What is claimed is:

1. A manufacturing method of a semiconductor device comprising a plasma etching step for performing plasma etching of a dielectric film containing Si formed on a substrate to be processed by use of a photoresist as a mask,
    wherein the plasma etching step performs the plasma etching by use of an etching gas comprising a mixed gas including a $C_4F_4O$ gas, $O_2$ gas, and at least one rare gas selected from the group consisting of Ne, Ar, Kr, and Xe, so as to etch the dielectric film containing Si selectively to the photoresist, and
    wherein a range of the ratio of a flow rate of the $O_2$ gas to a flow rate of the $C_4F_4O$ gas (flow rate of $O_2$ gas/flow rate of $C_4F_4O$ gas) in the etching gas is from not less than 1 to not more than 1.35.

2. The manufacturing method of the semiconductor device as set forth in claim 1,
    wherein the rare gas is an Ar gas.

3. The manufacturing method of the semiconductor device as set forth in claim 1,
    wherein the plasma etching step is performed by applying high-frequency power between an upper electrode and a lower electrode in a process chamber, the lower electrode in which the substrate to be processed is laid thereon and the upper electrode facing the lower electrode being arranged in the process chamber.

4. The manufacturing method of the semiconductor device as set forth in claim 3,
    wherein the high-frequency power comprises a first high-frequency power applied to the upper electrode and a second high-frequency power applied to the lower electrode,
wherein the second high-frequency power has a frequency lower than a frequency of the first high-frequency power.

5. The manufacturing method of the semiconductor device as set forth in claim 3,
    wherein the high-frequency power comprises a first high-frequency power applied to the lower electrode and a second high-frequency power applied to the lower electrode,
wherein the second high-frequency power has a frequency lower than a frequency of the first high-frequency power.

* * * * *